(12) United States Patent
Yamaguchi

(10) Patent No.: US 6,545,341 B2
(45) Date of Patent: Apr. 8, 2003

(54) POWER TRANSISTOR

(75) Inventor: Masakazu Yamaguchi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,227

(22) Filed: Mar. 27, 2001

(65) Prior Publication Data

US 2001/0035565 A1 Nov. 1, 2001

(30) Foreign Application Priority Data

Mar. 27, 2000 (JP) ........................... 2000-087550
Aug. 23, 2000 (JP) ........................... 2000-251854

(51) Int. Cl.⁷ ............... H01L 27/082; H01L 27/102; H01L 29/70; H01L 31/11
(52) U.S. Cl. ........................... 257/565; 257/570
(58) Field of Search ................ 257/565, 570, 257/578

(56) References Cited

U.S. PATENT DOCUMENTS

| | | | | |
|---|---|---|---|---|
| 5,281,872 A | * | 1/1994 | Mori .................. | 327/108 |
| 5,341,020 A | * | 8/1994 | Sasahara ............ | 257/127 |
| 5,973,384 A | * | 10/1999 | Ikegami ............. | 257/588 |
| 6,060,761 A | * | 5/2000 | Kawakita et al. .... | 257/557 |
| 6,114,727 A | | 9/2000 | Ogura et al. | |

FOREIGN PATENT DOCUMENTS

| | | |
|---|---|---|
| JP | 6-80817 | 10/1994 |
| JP | 7-321122 | 12/1995 |

OTHER PUBLICATIONS

Masayasu Ishiko, et al., "A Normally–Off Bipolar Mode Static Induction Transistor (BSIT) with High Current Gains", Proceedings of 1992 International Symposium on Power Semiconductor Devices & ICs Tokyo, May 1992. pp. 92–97.

Yoshinori Murakami, et al., "Grounded–Trench–MOS Structure Assisted Normally–Off Bipolar–Mode Power FET", Proceedings of 1996 International Symposium on Power Semiconductor Devices & ICs Hawaii, May 1996, pp. 345–348.

* cited by examiner

*Primary Examiner*—Stephen D. Meier
*Assistant Examiner*—Kiesha Rose
(74) *Attorney, Agent, or Firm*—Oblon, Spivak, McClelland, Maier & Neustadt, P.C.

(57) ABSTRACT

The present invention relates to a constitution of a bipolar type power transistor, which comprises: a base layer of a first conductivity type; a collector layer of the first conductivity type formed on one surface of the base layer of the first conductivity type; a first base layer of a second conductivity type formed selectively on the other surface of the base layer of the first conductivity type; and a second base layer of the second conductivity type selectively formed on the other surface of the first conductivity type base layer. The second conductivity type base layer is formed in a divided manner, and each of the second conductivity type base layers are separated by the first conductivity type base layer.

36 Claims, 17 Drawing Sheets

POWER TRANSISTOR

CROSS-REFERENCE TO RELATED APPLICATIONS

This application claims benefit of priority under 35 U.S.C. 119 to Japanese Patent Application No. P2000-87550 filed Mar. 27, 2000, and Japanese Patent Application No. P2000-251854 filed Aug. 23, 2000, the entire contents of which are incorporated by reference herein.

BACKGROUND OF THE INVENTION

1. Field of the Invention

The present invention relates to a power semiconductor device, more particularly to a bipolar type semiconductor device suitable as a power switching device.

2. Discussion of the Background

With receiving demands for miniaturization and high performance of a power equipment in recent power electronics, in the power semiconductor devices, a great deal of efforts have been exerted on improvements of performance for lower power loss, a faster operation speed and higher resistance to breakdown as well as a higher withstand voltage and a larger current flowing through the power semiconductor device. Particularly, to achieve the lower power loss of the semiconductor devices, an ON voltage (constant loss) and a turn-off loss need to be reduced, and various device structures have been developed and investigated. Among these devices, descriptions for a power transistor will be made as a typical middle capacity device used most frequently in a wide field.

FIG. 1(a) and FIG. 1(b) are sectional views showing a constitution of an npn- type power transistor, respectively. FIG. 1(b) is an enlarged view obtained by enlarging an area 24b surrounded by dot-dashed lines in FIG. 1(a). In this power transistor, a high concentration n-type collector layer 2a is formed on a surface of a high resistance n-type base layer 1a. A p-type base layer 3a is formed on the other surface of the n-type base layer 1a, and an n-type emitter layer 4a is selectively formed on a surface of the p-type base layer 3a. A base electrode 5a is formed on a region of the p-type base layer 3a other than that where the n-type emitter layer 4a is formed. A collector electrode 6a is provided on the n-type collector layer 2a, and a source electrode 7a is provided on the n-type emitter layer 4a.

This power transistor operates as follows. It is assumed that a positive voltage is applied to the collector electrode 6a and a zero voltage is applied to the emitter electrode 7a. At the time the power transistor is turned on, a positive voltage, which has a value larger than that of a built-in voltage of a pn junction composed of the p-type base layer 3a and the n-type emitter layer 4a, is applied to the base electrode 5a.

Thus, as shown in FIG. 2, holes h are injected from the base electrode 5a to the n-type emitter layer 4a via the p-type base layer 3a, and electrons e are injected from the n-type emitter layer 4a to the p-type base layer 3a. The electrons e partially disappear by recombining with the holes h in the p-type base layer 3a. However, because a junction depth of the p-type base layer 3a is formed to be relatively shallow and the collector electrode 6a is biased to be a positive potential, the electrons e are injected from the p-type base layer 3a to the n-type base layer 1a, and pass through the n-type collector layer 2a to flow into the collector electrode 6a.

Furthermore, when the electrons e are injected into the n-type base layer 1a, the holes h are also injected into n-type base layer 1a so as to satisfy a charge neutral condition. By this operation, a conductivity modulation is caused and the power transistor is allowed to be an on-state (conductive state).

On the other hand, at the time the power transistor is turned off, a negative voltage, which has a value smaller than that of a withstand voltage of a pn junction composed of the p-type base layer 3a and the n-type emitter layer 4a, is applied to the base electrode 5a. Upon the application of the negative voltage, a reverse bias is applied between the base and the emitter, thus stopping the electron injection from the n-type emitter layer 4a and discharging the holes h stored in the n-type base layer 1a from the base electrode 5a. As a result, the power transistor is turned off.

Since the conductivity modulation is caused in the n-type base layer 1a by injecting the holes h into the n-type base layer 1a from the p-type base layer 3a in this power transistor, the power transistor has a feature of that an on-voltage is low and a large current can be controlled. However, in the conventional power transistor, a considerable amount of the hole current injected from the base electrode 5a in its on-state is not injected into the n-type base layer 1a, but recombines with the electrons e within the p-type base layer 3a and in the surface of the p-type base layer 3a or flows directly into the n-type emitter layer 4a via the p-type base layer 3a.

Similarly, a considerable amount of the electron current injected from the emitter electrode 7a is not injected into the n-type base layer 1a, but recombines with the holes h within the p-type base layer 3a and in the surface of the p-type base layer 3a or flows directly into the baser electrode 5a via the p-type base layer 3a.

Therefore, there is a problem that a large base current is required and a current gain (direct current amplification coefficient: h FE=IC/IB) is small. Particularly, in the conventional structure, the p-type base layer 3a is formed over the entire of the device effective region except for the junction end portion and the boding pad region for obtaining a main withstand voltage. Here, because a carrier lifetime becomes shorter as impurity concentration becomes higher, the amount of the carrier recombination in the p-type base layer 3a becomes very large in the conventional structure in which the p-type base layer 3a is formed on the entire of the device effective region. As a result, a current gain is reduced.

As described above, because the current gain is small in the conventional transistor, Darlington-connected two transistors are used. Thus, though the base current may be small, a base current does not flow from the upper stage transistor to the lower stage transistor, if the collector voltage becomes about 0.8 V or more. For this reason, as shown in the current-voltage characteristic of FIG. 4, there is a matter that the on-voltage of the device cannot be reduced to 0.8 V or less.

As described above, in the conventional semiconductor device, there is a matter that the current gain is small, or a matter that the on-voltage is large.

SUMMARY OF THE INVENTION

The present invention was made to solve the foregoing problems, and it is an object of the invention to provide a semiconductor device having a trench gate, which is capable of increasing a channel region density and achieving low device resistance.

The present invention was made in consideration of the foregoing matters, and it is an object of the invention to provide a semiconductor device which is capable of increasing a current gain and reducing an on-voltage than conventional semiconductor device.

To achieve the foregoing object, a power transistor according to the present invention comprises: a base layer of a first conductivity type; a collector layer of the first conductivity type formed on one surface of the base layer of the first conductivity type; a first base layer of a second conductivity type selectively formed on the other surface of the base layer of the first conductivity type; and a second base layer of the second conductivity type selectively formed on the other surface of the base layer of the first conductivity type.

The base layer of the second conductivity type is formed dividedly from each other and each of the base layers of the second conductivity type is separated from each other by the base layer of the first conductivity type.

Furthermore, the power transistor according to the present invention is characterized in that an emitter layer of the first conductivity type is arranged dividedly from other emitter layers of the first conductivity type within the base layer of the second conductivity type.

Still furthermore, the power transistor according to the present invention is a current-driven type power transistor in which a voltage is applied to a base electrode and an emitter electrode.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Figure 1A:
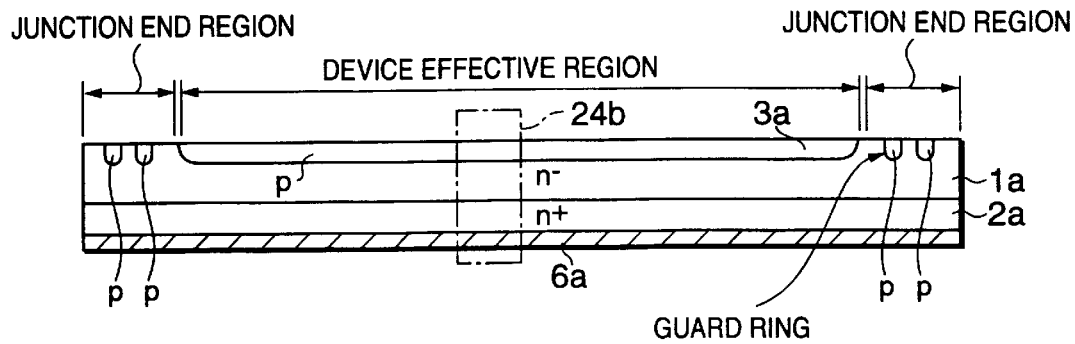
FIG. 1(a) and FIG. 1(b) are sectional views showing a conventional npn-type power transistor, respectively.

With receiving demands for miniaturization and high performance of a power equipment in recent power electronics, in the power semiconductor devices, a great deal of efforts have been exerted on improvements of performance for lower power loss, a faster operation speed and higher resistance to breakdown as well as a higher withstand voltage and a large current flowing through the power semiconductor device. Particularly, to achieve the lower power loss of the semiconductor devices, an ON voltage (constant loss) and a turn-off loss need to be reduced, and various device structures have been developed and investigated. Generally, power transistors are classified into voltage-driven type power transistors and current-driven type power transistors. As represented by power MOSFETs and IGBTs, the voltage-driven type power transistor has a constitution of a MOS transistor in which a turning on/off of the device is controlled by applying a voltage to its gate electrode. In general, as represented by power bipolar transistors, the current-driven type power transistors control a collector current by a base current to perform a switching operation. In the present invention of this application, among the current-driven type power transistors, a bipolar type power transistor will be described as typical medium capacity devices that have been used most frequently in a wide field at present.

Embodiments of the present invention will be described with reference to the accompanying drawings below. It should be noted that in all embodiments to be described below, a first conductivity type shall be an n-type and a second conductivity type shall be a p-type. Moreover, common constituent components shall be denoted by common reference numerals in all drawings.

First Embodiment

Figure 5A:
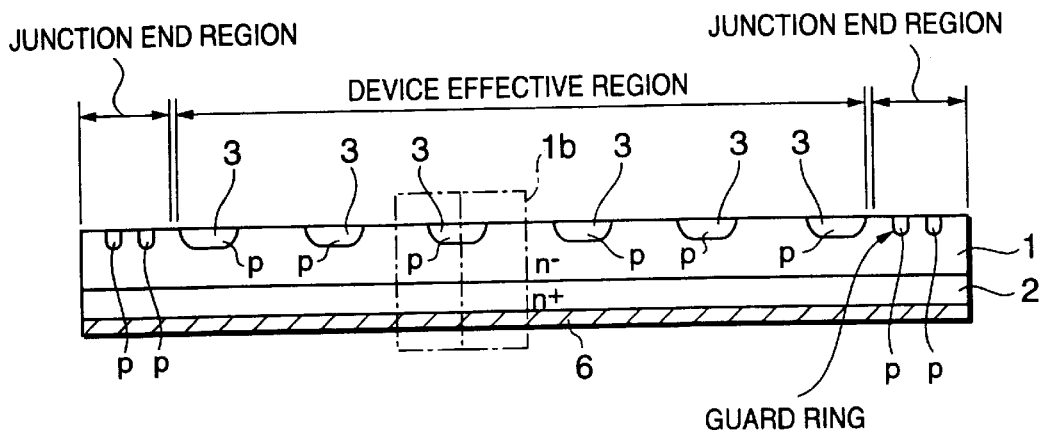
FIG. 5(a) and FIG. 5(b) are sectional views showing a semiconductor device according to a first embodiment of the present invention, respectively.
Figure 5B:
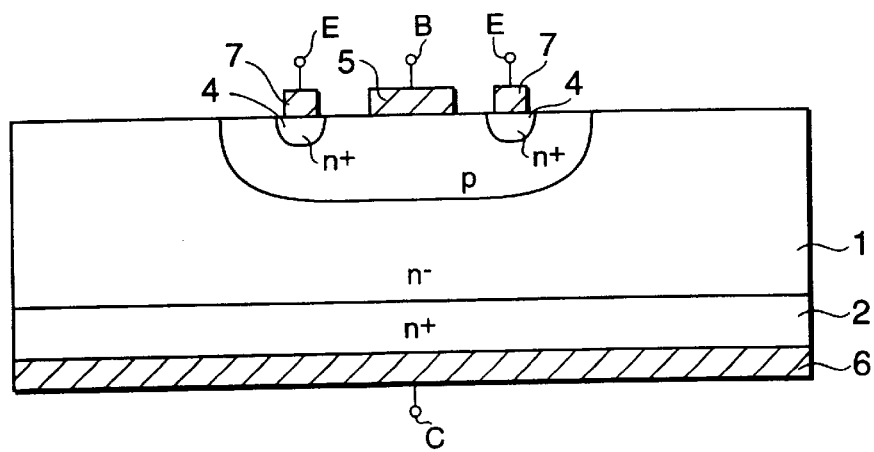

FIG. 5(a) and FIG. 5(b) are sectional views showing a principal part of a power transistor according to a first embodiment of the present invention, and FIG. 5(b) is an enlarged view obtained by enlarging an area 1b surrounded by dot-dashed lines in FIG. 5(a).

In this embodiment, a high concentration n-type collector layer 2 is formed on one surface of a high resistance n-type base layer 1. A p-type base layer 3 is selectively formed on the other surface of the n-type base layer 1, and an n-type emitter layer 4 is formed within the p-type base layer 3. On the p-type base layer 3, provided is a base electrode 5 so as to be adjacent to an n-type emitter layer 4. Furthermore, a collector electrode 6 is provided on the n-type collector layer 2, and an emitter electrode 7 is provided on the n-type emitter layer 4.

Figure 6:
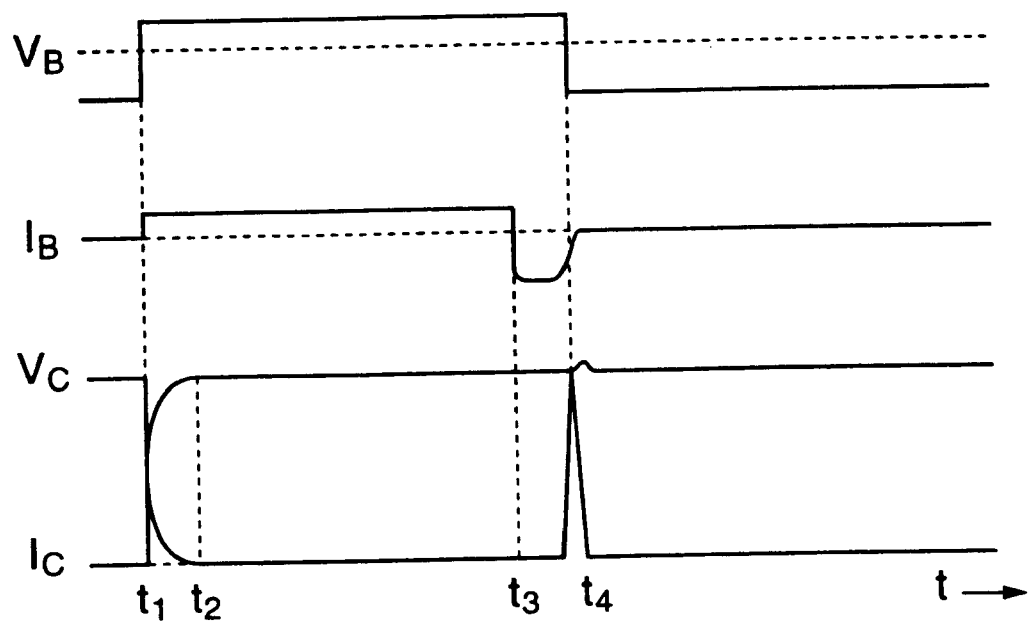
FIG. 6 is a timing chart showing an operation of the semiconductor device according to the first embodiment and a base driving method of the same.
Figure 7:
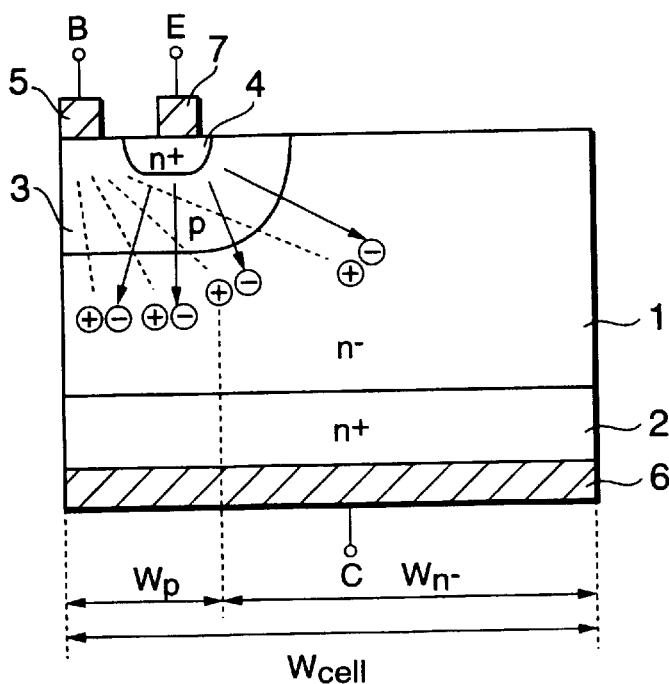
FIG. 7 is a schematic view showing a flow of carriers in an on-state of the semiconductor device according to the first embodiment.

Next, an operation of the semiconductor device having the above-described structure is described by the use of a timing chart of FIG. 6. The lines in FIG. 6 show a base voltage $V_B$ of a base terminal, a base current $I_B$ of the base terminal, a collector voltage $V_C$, and a collector current $I_C$ respectively from the above line. When the semiconductor device is turned on (time t=t1), a positive voltage relative to the emitter is applied to the base terminal. Thus, as shown in FIG. 7, holes (+) are injected from the p-type base layer 3 to the n-type base layer 1, and at the same time, electrons (−) are injected from the n-type emitter layer 4 to the n-type base layer 1. Accordingly, the device is turned on. As a result, a conductivity modulation is caused in the n-type base layer 1, and the device is turned on with a low on voltage.

Figure 8:
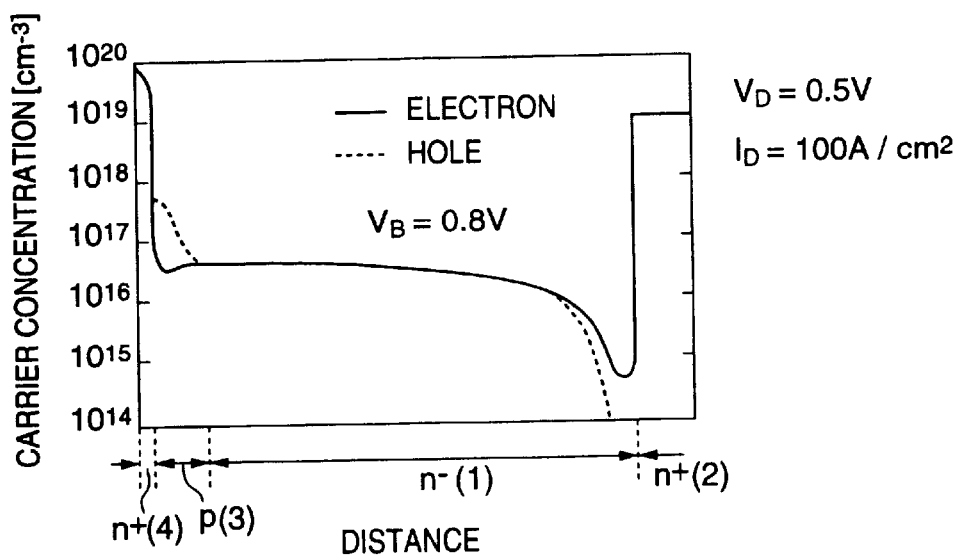
FIG. 8 is a view showing a carrier concentration distribution in the on-state of the semiconductor device according to the first embodiment.

FIG. 8 shows a carrier distribution in an on-state in a vertical section of the n-type emitter layer 4. In FIG. 8, the solid line shows carrier concentration of electrons and dot line shows carrier concentration of holes. As is shown in FIG. 8, a lot of holes are injected to whole area (which area is extending from surface of n-type base layer 1 to deep position n-type base layer 1) of the n-type base layer 1, thus causing the conductivity modulation. Thus, the on-voltage is reduced. This is because recombinations of the electrons e and hole currents h in the p-type base layer 3 can be prevented as little as possible since a region of the p-type base layer 3 occupying the n-type base layer 1 is made to be small.

Figure 1B:
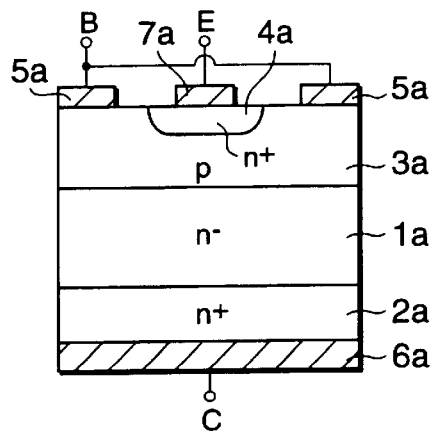
Figure 2:
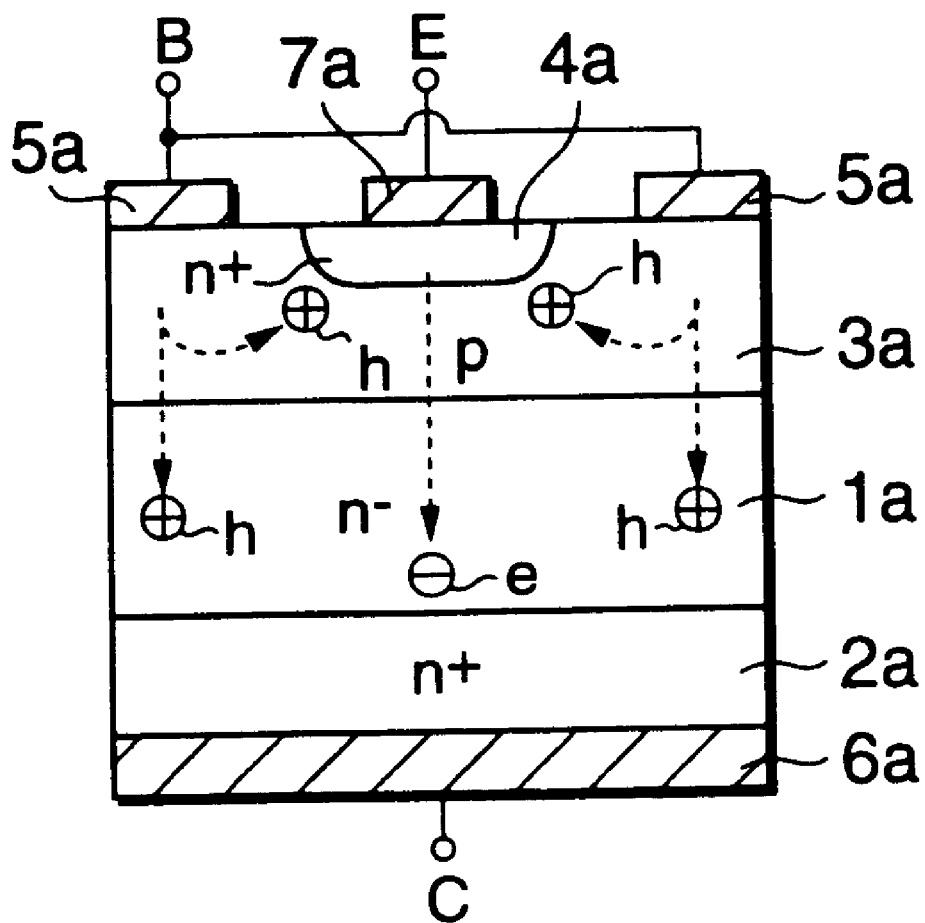
FIG. 2 is a schematic view showing a flow of carriers in an on-state of the conventional npn-type power transistor.
Figure 9:
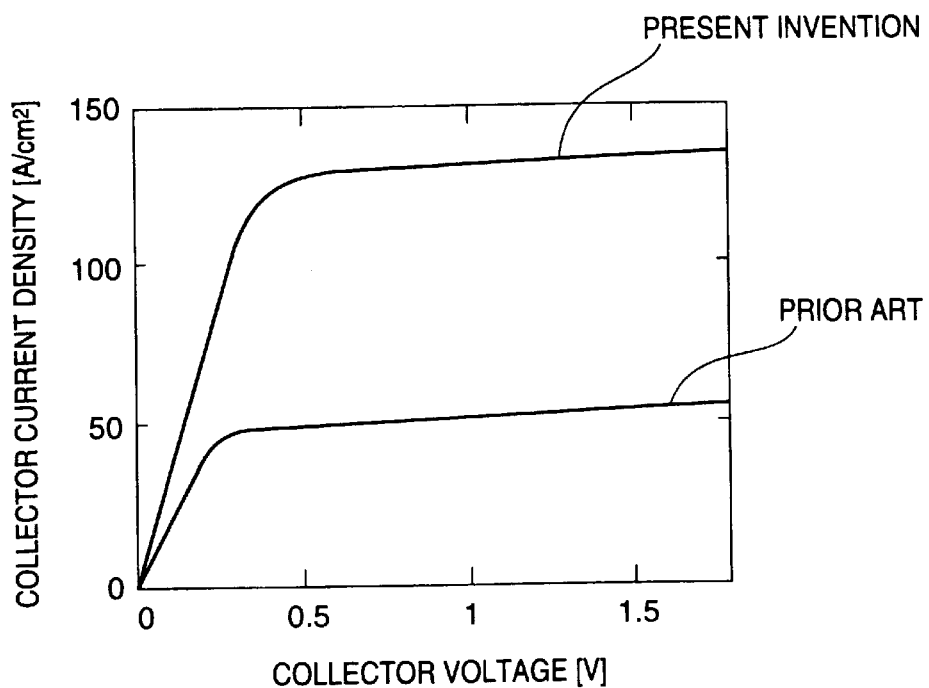
FIG. 9 is a characteristic view in which a current-voltage characteristic of the semiconductor device according to the first embodiment is compared with a current-voltage characteristic of the conventional semiconductor device.

FIG. 9 is a comparative view of the current-voltage characteristic of the conventional power transistor shown in FIG. 1 and the current-voltage characteristic of the power transistor of this embodiment. The collector current-voltage characteristics in the case where 3 [A/cm²] is applied to both of the power transistors according to the first embodiment and the conventional power transistor as a base current are shown.

For example, a collector current of about 100 [A/cm²] as a rated current must be generated to operate a power semiconductor device for use in electric cars. According to the first embodiment, the transistor operates at the time when a collector voltage equal to 0.3 [V] is applied, and a collector current of about 100 [A/cm²] can be generated. However, in the case of the conventional power transistor, even if the transistor operates at the time when the collector current equal to 0.3 [V] is applied, a collector current as small as about 40 [A/cm²] can only be generated. If it is intended to make the current-voltage characteristic of this transistor close to that of the power transistor of the first embodiment, a base current of 15 [A/cm²] or more must be applied, and hence a power consumption of the transistor becomes large.

As a result, since a current rises from a zero voltage as shown in FIG. 9, the low on-voltage can be obtained from the low current region to the high current region.

Figure 3:
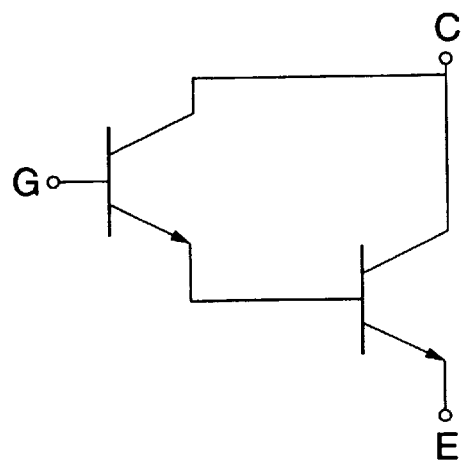
FIG. 3 is a view showing a Darlington connection when the conventional npn-type power transistor is used.
Figure 4:
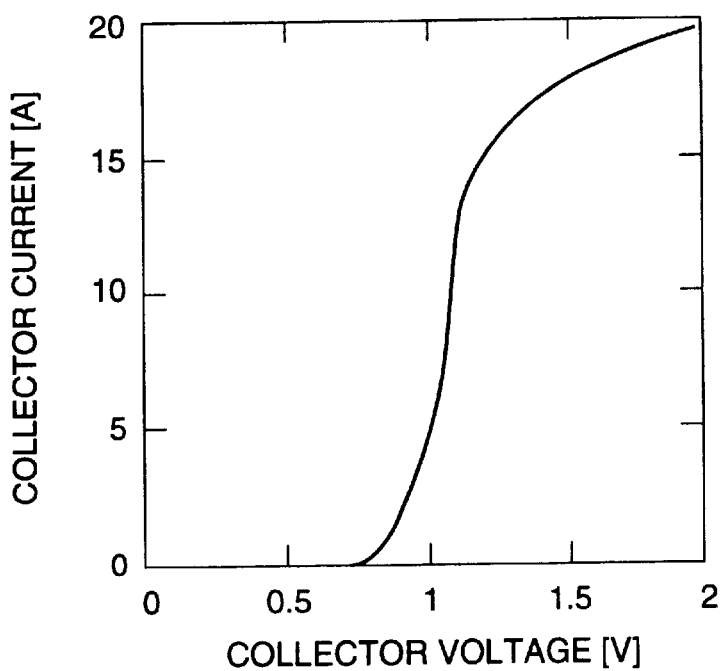
FIG. 4 is a characteristic view showing a current-voltage characteristic of a constitution shown in FIG. 3.

Furthermore, since the conventional semiconductor device is used in a Darlington connection as shown in FIG. 3, the voltage-current characteristic rises up from about 0.8 V. On the contrary, since in the semiconductor device of the present invention, a base current necessary to obtain a low on-voltage is small and a current gain (direct current amplification coefficient: h FS=ID/IB) is large, the semiconductor device of the present invention needs not to be used in the Darlington connection. Accordingly, the power transistor can be constituted of the transistors of the small number.

Figure 10:
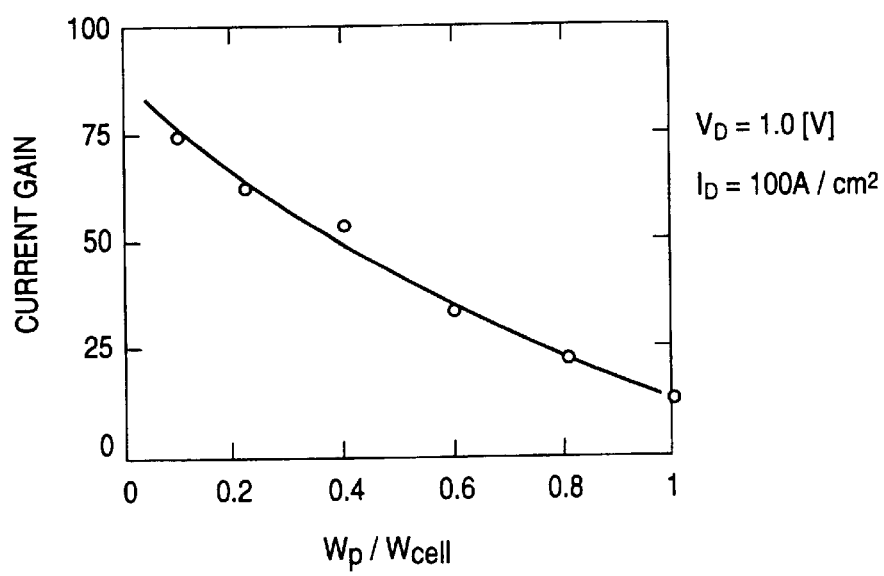
FIG. 10 is a characteristic view showing a p-type base layer width dependency on a current gain of the semiconductor device according to the first embodiment.

Here, the reason why a large current gain can be obtained in the semiconductor device of the present invention is described. FIG. 10 is a characteristic view showing a dependency of the current gain on a width of the p-type base layer 3 in the semiconductor device shown in FIG. 5.

Investigations by the inventors of this application proved that the current gain greatly depends on a ratio of an area of an impurity layer to a unit structure area (cell area). If this is applied to this embodiment, the current gain greatly depends on an occupation ratio (W p/W cell) of the p-type base layer 3 and an occupation ratio (W n⁺/W cell) of the n-type emitter layer 4. This arises from that as an impurity concentration is higher, a carrier lifetime is shorter. Specifically, when the area of the p-type base layer 3 and the area of the n-type emitter layer 4 are large, the amount of carriers (recombination current) of holes injected from the base electrode 5, which recombine with electrons in the impurity layer, increases, and hence the current gain decreases. On the contrary, in the semiconductor device of the present invention, each of the p-type base layers 3 is selectively formed dividedly from other layers 3, and the area of each of the p-type base layers 3 can be set to be small. Therefore, a large current gain can be achieved. To be concrete, by forming the p-type base layer 3 having dimensions of the W cell of 20 μm and the W p of 8 μm, the current gain h FS of 50 or more can be obtained.

Figure 11:
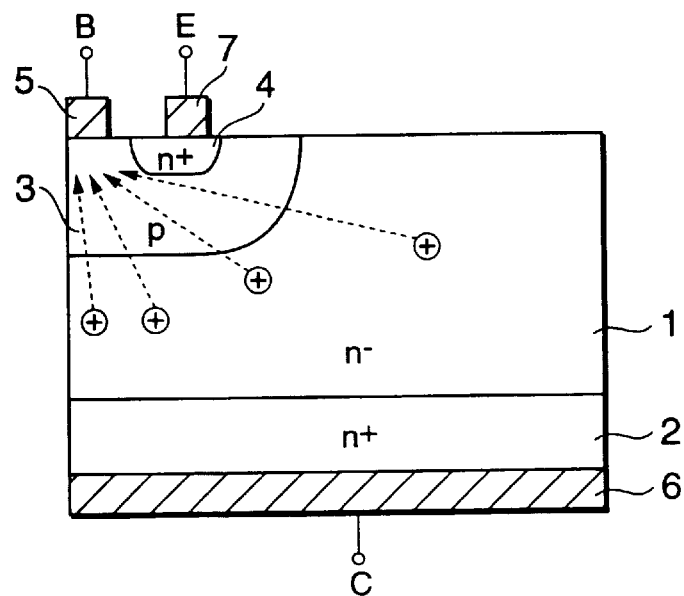
FIG. 11 is a schematic view showing a flow of carriers when the semiconductor device according to the first embodiment is turned off.

On the other hand, in the semiconductor device corresponding to the first embodiment, a negative voltage is applied to the base terminal when the semiconductor device is turned off (time t=t3). Thus, as shown in FIG. 11, the holes (+) stored in the n-type base layer 1 are discharged to the outside of the device from the base electrode 5 via the p-type base layer 3. Accompanied with the discharge of the holes (+), a potential of the p-type base layer 3 is lowered to a built-in voltage of the pn junction or less, so that the injection of the electrons from the n-type emitter layer 4 is stopped and the device is turned off (time t=t3 to t4). Since the holes (+) are discharged via the base electrode 5 provided so as to be adjacent to the n-type emitter layer 4 when the device is turned off, it is possible to realize a semiconductor device having a high turning-off capability.

Moreover, in the off-state of the semiconductor device, after the semiconductor device is turned off, a negative voltage relative to the emitter is applied to the base terminal 5 (time t=t4~). Thus, since a potential of the p-type base layer 3 is fixed to a negative potential via the base electrode 5, it is possible to prevent an erroneous ignition due to noises.

As described above, according to the first embodiment, the carriers of both of the electrons and the holes are stored to a deep position of the n-type base layer 1 when the semiconductor device is in the turn-on state, and the conductivity modulation is caused. At the same time, the carrier recombination in the p-type base layer 3 and the n-type emitter layer 4 is reduced. Accordingly, the high current gain (direct current amplification coefficient) can be realized. Moreover, when the semiconductor device is in the turn-off state, the holes are discharged via the base electrode 5 provided so as to be adjacent to the n-type emitter layer 4. Accordingly, a high turn-off capability can be obtained. In addition, when the semiconductor device is in the turn-off state, since the potential of the p-type base layer 3 is fixed to the negative potential by applying the negative voltage relative to the emitter to the base electrode 5, it is possible to prevent the erroneous ignition due to noises.

Second Embodiment

Figure 12:
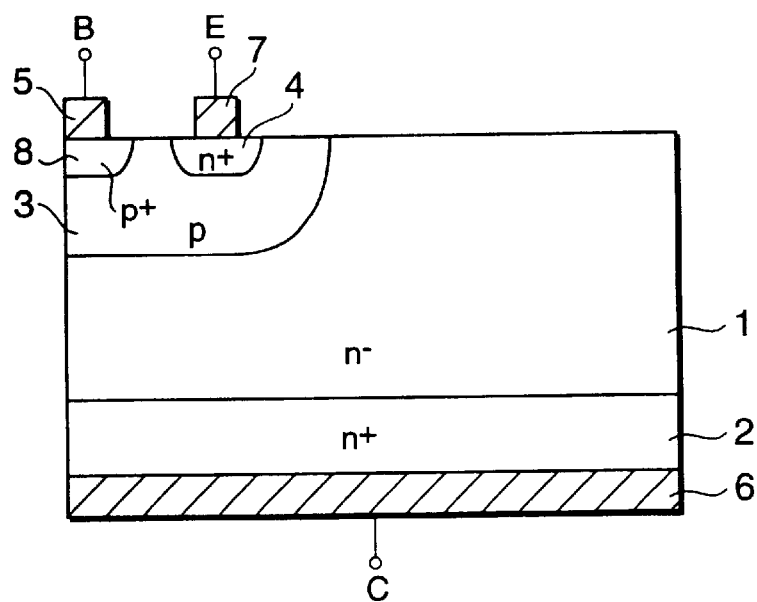
FIG. 12 is a sectional view showing a semiconductor device according to a second embodiment of the present invention.

FIG. 12 is a sectional view showing a structure of a principal part of a semiconductor device according to a second embodiment of the present invention.

In this embodiment, unlike the first embodiment shown in FIG. 5, a $p^+$-type layer 8 adjacent to an n-type emitter layer 7 is formed on a p-type base layer 3, and a base electrode 5 is provided on the $p^+$-type layer 8. Thus, since a contact resistance of the base electrode 5 is reduced, holes are injected thereto when the semiconductor device is turned on, and the holes can be discharged more quickly when the semiconductor device is turned off.

Several plan structures of the semiconductor device of the second embodiment are described as a modification example below.

Modification Example 1 of Second Embodiment

Figure 13:
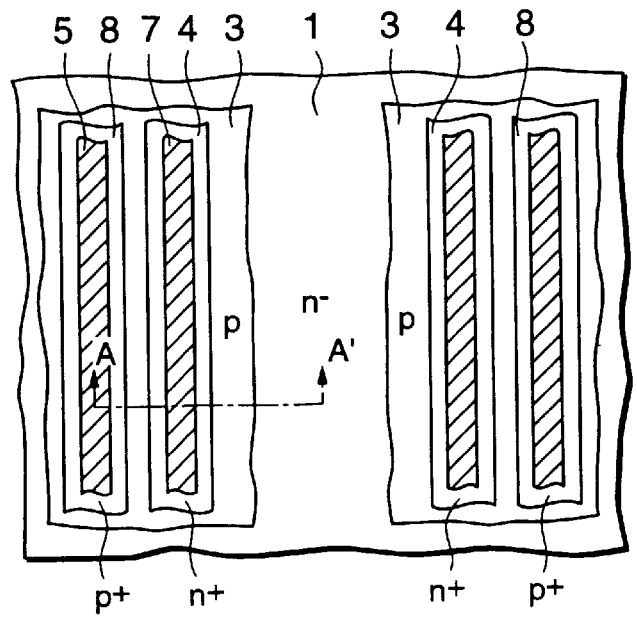
FIG. 13 is a plan view showing a first modification constitution of the second embodiment.

FIG. 13 is a plan view showing a first modification constitution of the second embodiment of the present invention, and a section taken along the line A–A' of FIG. 13 corresponds to the sectional view shown in FIG. 12.

Specifically, this embodiment defines a plan constitution of the sectional structure shown in FIG. 12, in which an n-type emitter layer 4 and a $p^+$-type layer 8 are formed to be stripe-shaped. With this plan structure, a high current gain and a high turn-off capability can be realized by the principle similar to that described from FIG. 5 to FIG. 12.

Modification Example 2 of Second Embodiment

Figure 14:
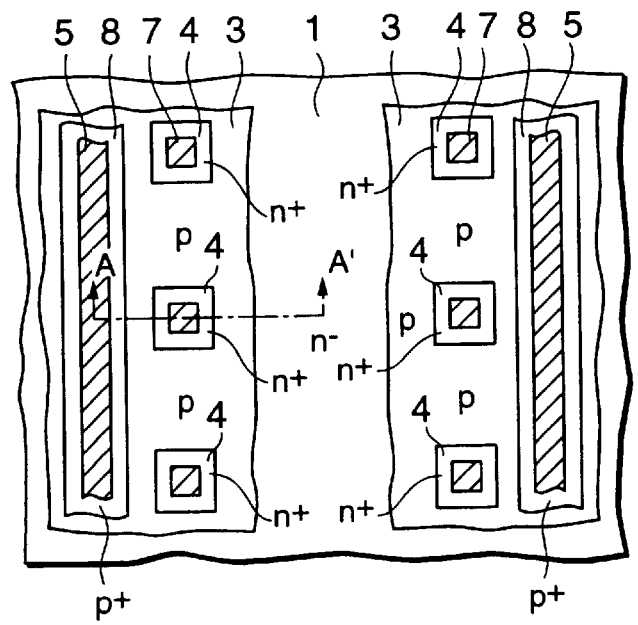
FIG. 14 is a plan view showing a second modification constitution of the second embodiment.

FIG. 14 is a plan view showing a second modification constitution of the second embodiment of the present invention, and a section taken along the line A–A' of FIG. 14 corresponds to the sectional view shown in FIG. 12.

Figure 15:
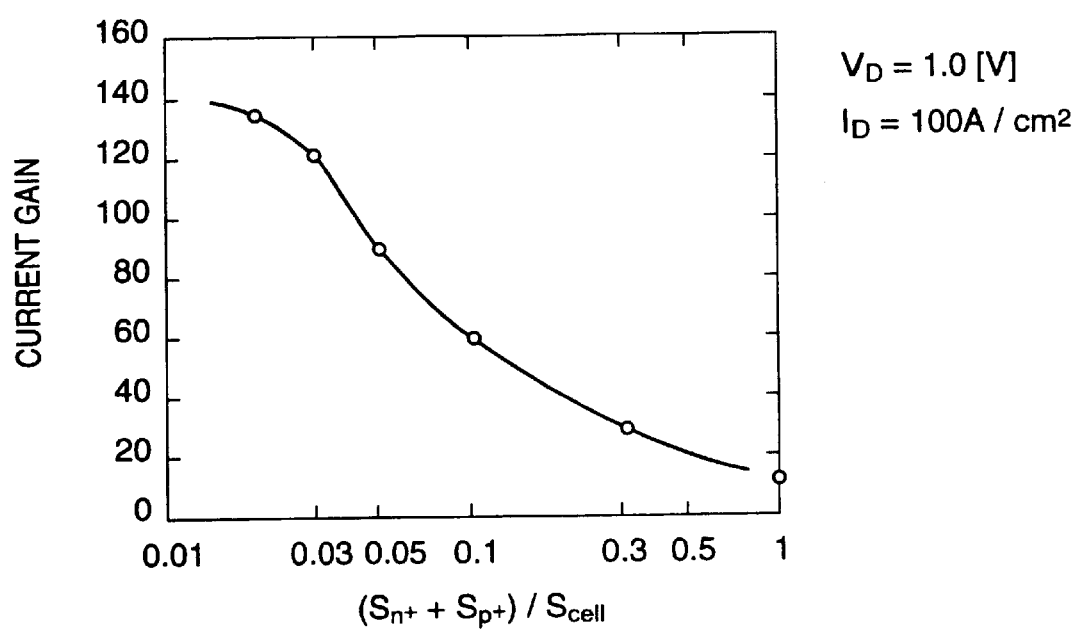
FIG. 15 is a characteristic view showing a high concentration layer width dependency on a current gain of the semiconductor device shown in FIG. 14.

Specifically, this embodiment defines a plan constitution of the sectional structure shown in FIG. 12, in which a plurality of n-type emitter layers 4 are formed to be rectangular and each of them is dividedly arranged by a predetermined distance two-dimensionally. With this plan structure, since an area ratio of the n-type emitter layer 4 (S $n^+$/S cell) to the cell area can be made small, carrier recombination in the n-type emitter layer 4 is decreased, and hence a current gain is more increased as shown in FIG. 15. To be concrete, when a width of the n-type emitter layer 4 is formed in 2 $\mu$m and a repetition pitch in a depth direction is formed in 8 $\mu$m, an area ratio ((S $n^+$)+(S $p^+$)/S cell) of the $p^+$-type layer 8 to the n-type emitter layer 4 is 0.05, and a current gain more than h FS=80 can be obtained.

Moreover, in the embodiment shown in FIG. 14, since each of the n-type emitter layers 4 is formed in a minute rectangular shape, the holes are discharged from the four sides of each of the rectangular n-type emitter layers 4 when the semiconductor device is turned off. Accordingly, a higher turn-off capability can be realized. Particularly, when width of the n-type emitter layer 4 that has been several ten $\mu$m in the conventional semiconductor device is formed in 10 $\mu$m or less, an effect of an increase of the turn-off capability becomes more conspicuous. Furthermore, by allowing the semiconductor device to perform a turn-off drive in a hard drive manner, that is, a current gain of 1 or nearly equal to 1, turn-off loss in the device is remarkably reduced, and breakdown of the device when the device is turned off can be prevented.

Modification Example 3 of Second Embodiment

Figure 16:
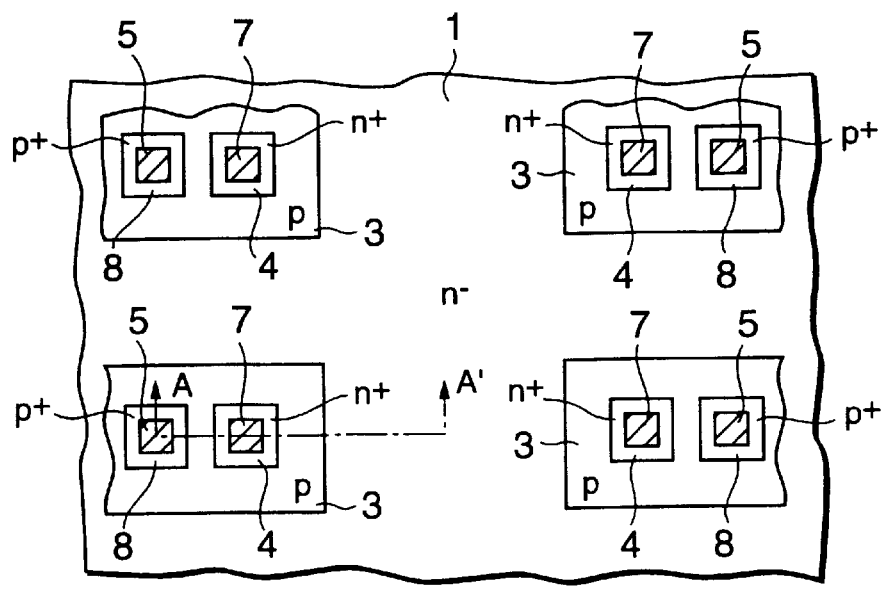
FIG. 16 is a plan view showing a third modification constitution of the second embodiment.

FIG. 16 is a plan view showing a third modification constitution of the second embodiment of the present invention, and a section taken along the line A–A' of FIG. 16 corresponds to the sectional view shown in FIG. 12. Specifically, this embodiment defines the plan constitution of the section structure shown in FIG. 12.

The plan view of FIG. 16 differs from the plan view of FIG. 14 in that not only the n-type emitter layer 4 but also the p-type base layer 3 and the $p^+$-type layer 8 are formed in a rectangular shape, the p-type base layer 3 and the $p^+$-type layer 8 are two-dimensionally arranged so as to be divided from each other by a predetermined distance. Thus, an area ratio ((S $n^+$)+(S $p^+$)/S cell) of the n-type emitter layer 4 and the $p^+$-type layer 8 to the cell area and an area ratio (S pb/S cell) of the p-type base layer 3 to the cell area can be made small, so that a larger current gain can be obtained.

Modification Example 4 of Second Embodiment

Figure 17:
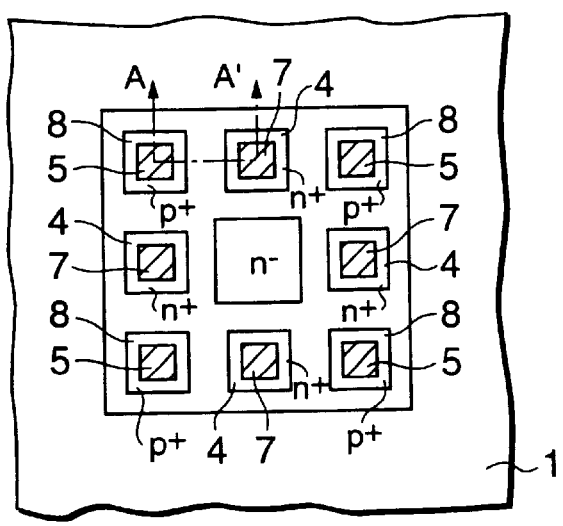
FIG. 17 is a plan view showing a fourth modification constitution of the second embodiment.

FIG. 17 is a plan view showing a fourth modification constitution of the second embodiment of the present invention, and a section taken along the line A–A' of FIG. 17 corresponds to the sectional view shown in FIG. 12. Specifically, this embodiment defines the plan constitution of the section structure shown in FIG. 12. The plan view of FIG. 17 differs from the plan view of FIG. 16 in that the p-type base layer 3 is formed in a ring shape. In the p-type base layer 3, the n-type emitter layer 4 and the $p^+$-type layer 8 are formed in a rectangular shape, and are arranged two-dimensionally so as to be divided from each other by a predetermined distance. Thus, since it is possible to surround both sides of the n-type emitter layer 4 by the $p^+$-type layer 8, discharging of the holes when the device is turned off is performed quickly, resulting in improving a turn-off capability.

Modification Example 5 of Second Embodiment

Figure 18:
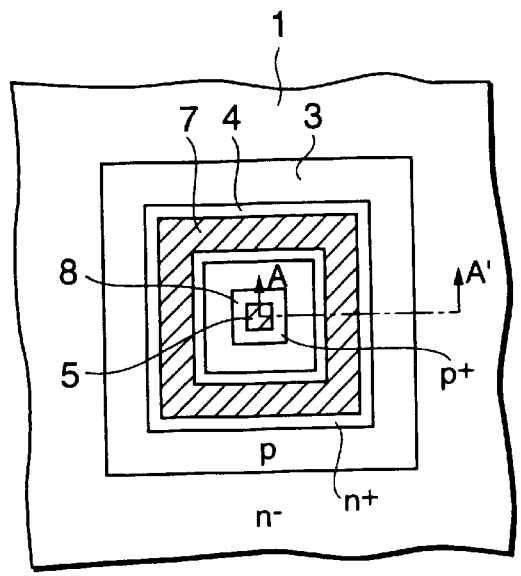
FIG. 18 is a plan view showing a fifth modification constitution of the second embodiment.

FIG. 18 is a plan view showing a fifth modification constitution of the second embodiment of the present invention, and a section taken along the line A–A' of FIG. 18 corresponds to the sectional view shown in FIG. 12. Specifically, this embodiment defines the plan constitution of the section structure shown in FIG. 12. In FIG. 18, the p-type base layer 3 is formed in a mesh shape. In the p-type base layer 3, the n-type emitter layer 4 is formed in a ring shape, and the p$^+$-type layer 8 is formed in a stripe shape. With this plan structure, a high current gain and a high turn-off capability can be realized by a principle similar to the principle described in FIG. 5 to FIG. 12.

Modification Example 6 of Second Embodiment

Figure 19:
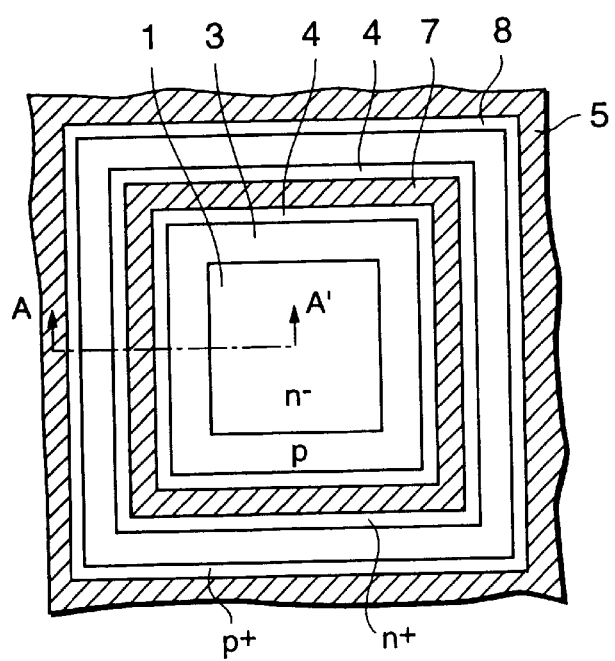
FIG. 19 is a plan view showing a sixth modification constitution of the second embodiment.

FIG. 19 is a plan view showing a sixth modification constitution of the second embodiment of the present invention, and a section taken along the line A–A' of FIG. 19 corresponds to the sectional view shown in FIG. 12. Specifically, this embodiment defines the plan constitution of the section structure shown in FIG. 12. In FIG. 19, the p-type base layer 3 is formed in a lattice shape. In this plan structure, the p$^+$-type layer 8 is formed so as to be adjacent to the n-type emitter layer 4 formed in a ring shape, around the entire periphery of the n-type emitter layer 4. Accordingly, a higher turn-off capability can be realized.

Third Embodiment

Figure 20:
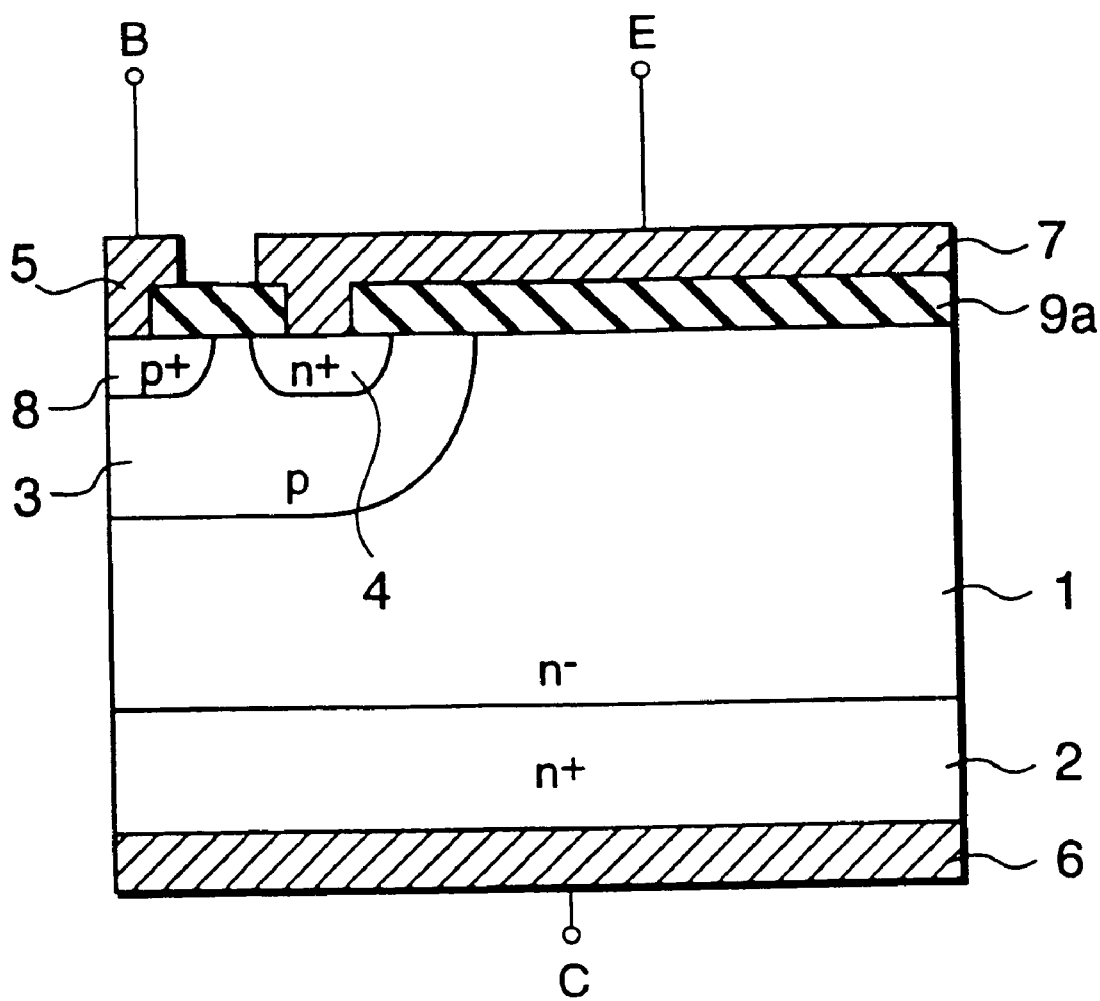
FIG. 20 is a sectional view showing a semiconductor device according to a third embodiment of the present invention.

FIG. 20 is a sectional view showing a structure of a principal part of a semiconductor device according to a third embodiment of the present invention. In this embodiment, unlike the second embodiment shown in FIG. 12, p-type base layers 3 are selectively formed dividedly from each other so as to interpose the n-type base layer 1, and an emitter electrode 7 is provided on a surface of an n-type base layer 1 with an insulating film 9a therebetween. Thus, an inversion layer or a charge storing layer is formed on a surface of the n-type base layer 1 contacting to the insulating film 9a when the device is in a turn-off state, and electrons and holes are made to be impossible to approach to each other. Therefore, surface recombination can be prevented, and a current gain is more increased. Furthermore, when the device is turned off, a depletion layer is quickly formed between the p-type base layers 3 adjacent to each other, so that high resistance to breakdown can be obtained.

Fourth Embodiment

Figure 21:
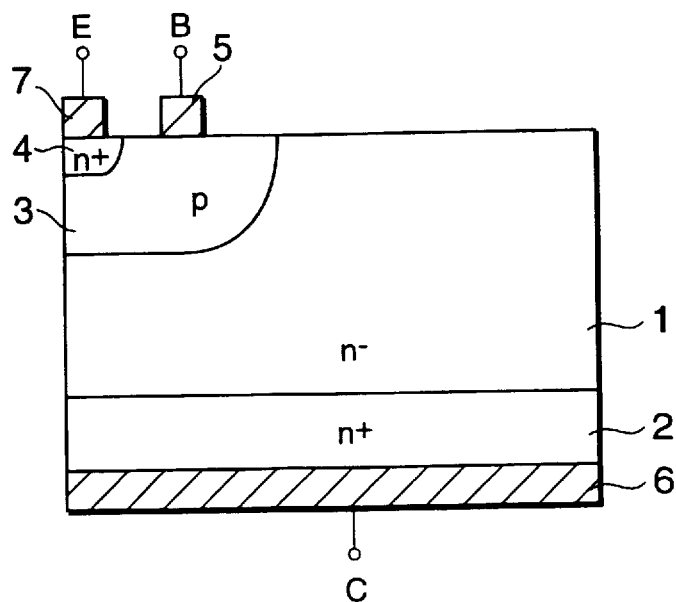
FIG. 21 is a sectional view showing a semiconductor device according to a fourth embodiment of the present invention.

FIG. 21 is a sectional view showing a structure of a principal part of a semiconductor device according to a fourth embodiment of the present invention.

In this embodiment, unlike the first embodiment shown in FIG. 5, an n-type emitter layer 4 is formed at a position two-dimensionally inside each of p-type base layers 3 selectively formed dividedly from others, and a base electrode 5 is provided at a position two-dimensionally outside each of the p-type base layers 3. Thus, since the n-type emitter layer 4 is interposed by the base electrode 5, so that holes are discharged from both ends of the n-type emitter layer 4 when the device is turned off. As a result, a higher turn-off capability can be obtained.

Fifth Embodiment

Figure 22:
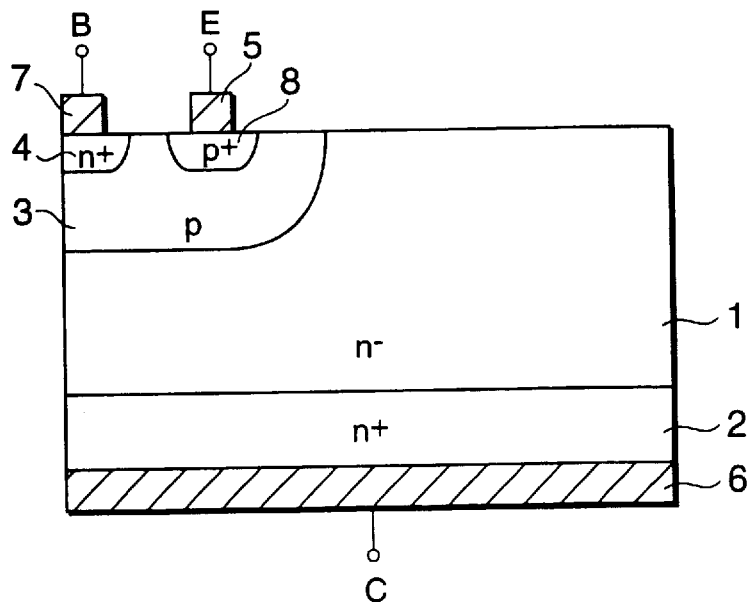
FIG. 22 is a sectional view showing a semiconductor device according to a fifth embodiment of the present invention.

FIG. 22 is a sectional view showing a structure of a principal part of a semiconductor device according to a fifth embodiment of the present invention. In this embodiment, unlike the fourth embodiment shown in FIG. 21, a p$^+$-type layer 8 is formed in an outer peripheral position of a surface of a p-type base layer 3 and a base electrode 5 is formed on the p$^+$-type layer 8. Thus, since an n-type emitter layer 4 is interposed by the p$^+$-type layers 8, it is possible to secure a withstand voltage even when a concentration of the p-type base layer 3 just under the n-type emitter layer 4 is reduced.

As described above, since the concentration of the p-type base layer 3 can be reduced, the amount of electrons injected into the n-type base layer 1 beyond an emitter junction constituted of the n-type emitter layer 4 and the p-type base layer 3 increases, so that a higher current gain can be realized.

Sixth Embodiment

Figure 23:
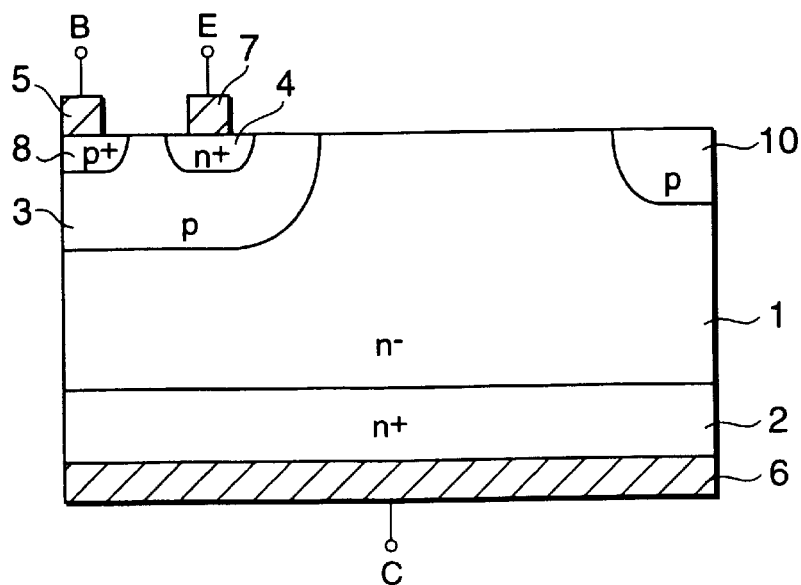
FIG. 23 is a sectional view showing a semiconductor device according to a sixth embodiment of the present invention.

FIG. 23 is a sectional view showing a structure of a principal part of a semiconductor device according to a sixth embodiment of the present invention. In this embodiment, unlike the second embodiment shown in FIG. 12, a p-type layer 10 is formed apart from the p-type base layer by a predetermined distance, in a surface of a n-type base layer 1 between p-type base layers 3 selectively formed dividedly from each other. Thus, depletion layers are respectively produced from the p-type base layer 3 and the p-type layer 10, and the depletion layers contact to each other. Here, the p-type layer 10 can be formed to be smaller than the p-type base layer 3 in which an n-type emitter layer 4 and a p$^+$-type layer 8 are formed, p base occupation rate (S pb/S cell) can be reduced while maintaining a high withstand voltage, so that a higher current gain can be realized.

Seventh Embodiment

Figure 24:
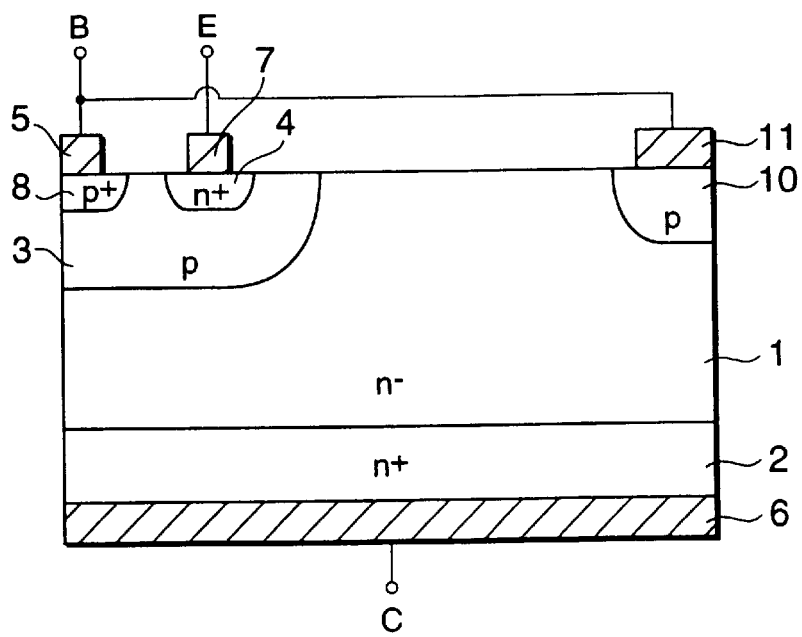
FIG. 24 is a sectional view showing a semiconductor device according to a seventh embodiment of the present invention.

FIG. 24 is a sectional view showing a structure of a principal part of a semiconductor device according to a seventh embodiment of the present invention. In this embodiment, unlike the sixth embodiment shown in FIG. 23, a second base electrode 11 is formed on the p-type layer 10, and a first base electrode 5 and the second base electrode 11 are electrically connected to each other. Thus, since holes are injected/discharged also to/from the p-type layer 10, it is possible to further increase a turn-on capability and a turn-off capability.

Eighth Embodiment

Figure 25:
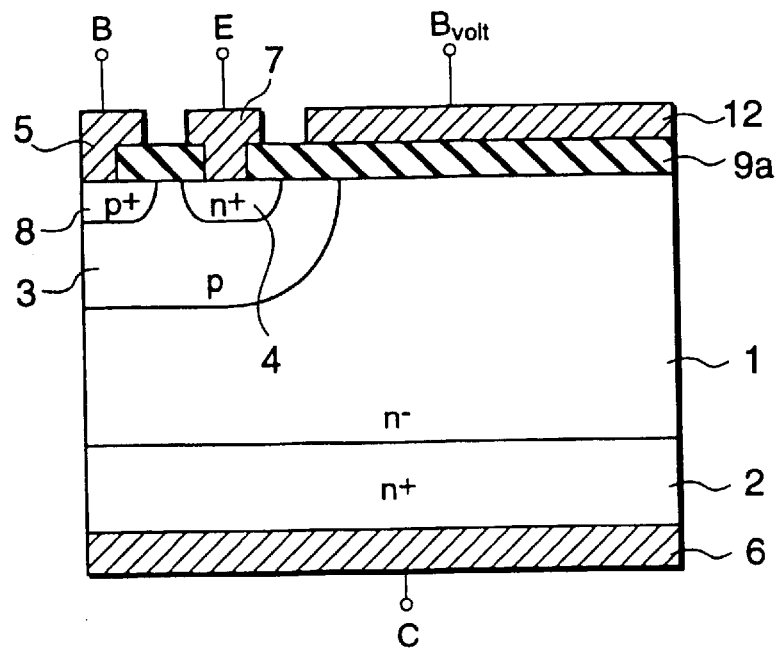
FIG. 25 is a sectional view showing a semiconductor device according to an eighth embodiment of the present invention.

FIG. 25 is a sectional view showing a structure of a principal part of a semiconductor device according to an eighth embodiment of the present invention. In this embodiment, unlike the second embodiment shown in FIG. 12, an insulating gate electrode 12 is provided on a surface of the n-type base layer 1 between the p-type base layers 3 with the insulating film 9a therebetween, each base layer 3 being selectively formed dividedly from others. The device of this embodiment is driven in the following manner. When the device is turned on, a positive voltage relative to the emitter electrode 5 is applied to both of the current base electrode 5 and the insulating base electrode 12. When the device is turned off, a negative voltage is applied thereto. Thus, since an electron storing layer and an electron inversion layer are formed on the surface of the p-type base layer 3 and the n-type base layer 1 just below the insulating base electrode 12 when the device is turned on and in the turn-on state, electrons and holes cannot approach to each other, so that surface recombination can be prevented. Accordingly, a low on-voltage can be obtained. On the other hand, when the device is turned off, a hole inversion layer is formed in the surface of the n-type base layer 1 just below the insulating base electrode 12. Accordingly, the turn-off capability can be further improved.

Ninth Embodiment

Figure 26:
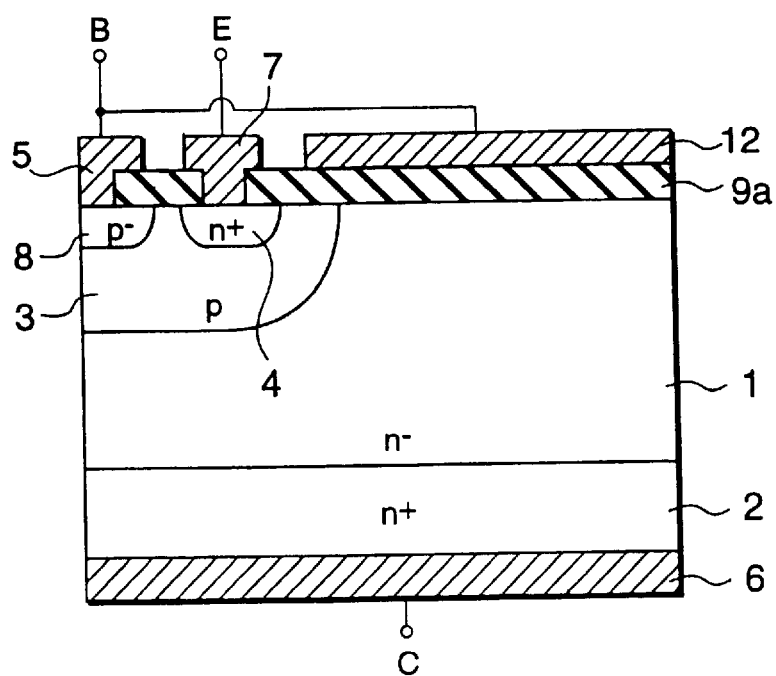
FIG. 26 is a sectional view showing a semiconductor device according to a ninth embodiment of the present invention.

FIG. 26 is a sectional view showing a structure of a principal part of a semiconductor device according to a ninth embodiment of the present invention. In this embodiment, in the structure shown as the eighth embodiment illustrated in FIG. 25, the current base electrode 5 and the insulating gate electrode 12 are electrically connected. Thus, a function identical to that of the eighth embodiment shown in FIG. 25 is given by one base terminal.

Tenth Embodiment

Figure 27A:
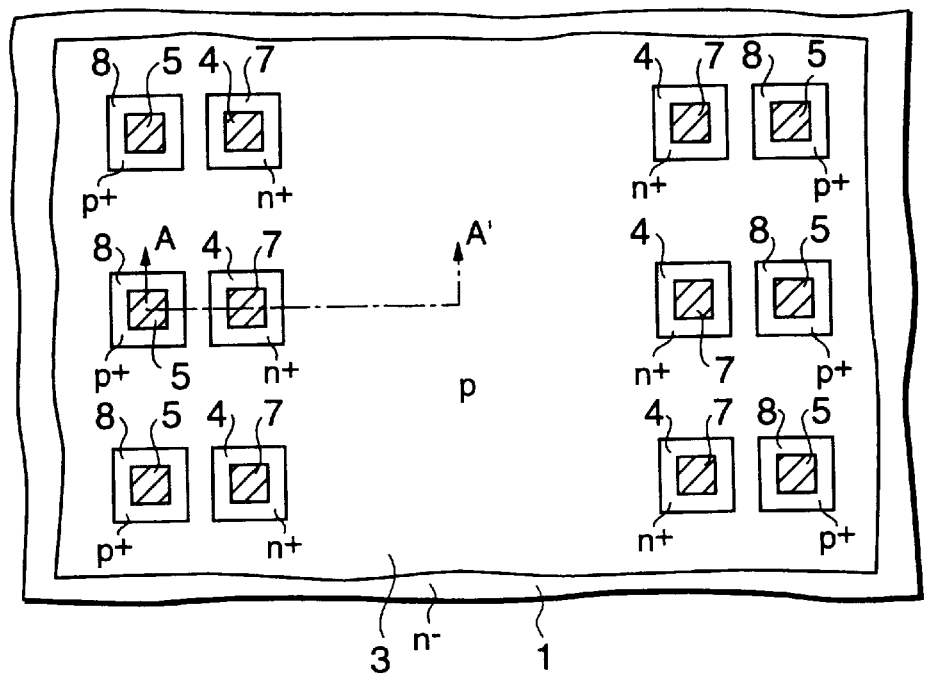
FIG. 27(a) is a plan view showing a semiconductor device according to a tenth embodiment of the present invention.
Figure 27B:
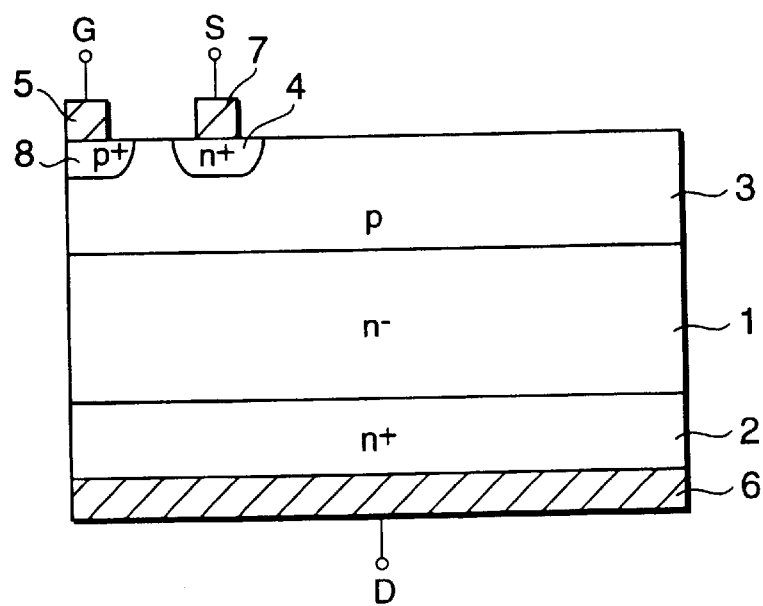
FIG. 27(b) is a sectional view taken along the line A–A' of FIG. 27(a).

FIG. 27(a) is a plan view showing a tenth embodiment of the present invention, and FIG. 27(b) is a sectional view taken along the line A–A' in FIG. 27(a). This embodiment differs from FIG. 16 and FIG. 12 in that the p-type base layer 3 is formed all over the unit structure region (cell region) of the device. Thus, a desired withstand voltage can be easily obtained even when a concentration of the p-type base layer 3 is reduced. Electrons injected to the n-type base layer 1 beyond an emitter junction constituted of the n-type emitter layer 4 and the p-type base layer 3 increase by the amount equivalent to the reduction of the concentration of the p-type base layer 3. As a result, a high current gain can be obtained. This embodiment greatly differs from the conventional structure in that similarly to FIG. 12 and FIG. 16, the n-type emitter layer 4 and the p+-type layer 8 are formed in a rectangular shape, and the structure of this embodiment is constructed so that an area ratio may be small.

As described above in detail, according to the present invention, the carriers of the electrons and the holes are stored to a deep position of the n-type base layer 1 and the conductivity modulation is caused when the device is in an on-state. At the same time, the carrier recombination in the p-type base layer 3 and each impurity layer of the n-type emitter layer 4 and the p+-type layer 8 is reduced. Accordingly, a high current gain (direct current amplification coefficient) can be realized. Moreover, the power transistor according to the present invention comprises the base electrode, the collector electrode and the emitter electrode, and these electrodes are sometimes called a gate electrode, a drain electrode and a source electrode, respectively. This is because an insulating type control electrode is generally called an insulating gate without depending on whether the power transistor of the present invention is a current control device or a voltage control device. Although names of the electrodes of MOS transistors are used, an operation has the same constitution as that of the power transistor disclosed in the present invention.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed, but that the invention include all embodiments falling within the scope of the appended claims.

What is claimed is as new and desired to be secured by Letters patent of the United States is:

1. A power transistor comprising:
a first base layer of a first conductivity type;
a collector layer of the first conductivity type formed on a first surface of said first base layer;
a plurality of second base layers of a second conductivity type formed selectively in a second surface of said first base layer, each of the second base layers formed divided from each other and corresponding to a unit structure area;
an emitter layer of the first conductivity type formed in a surface of each of said second base layers;
a first base electrode formed on the surface of each of said second base layers;
a collector electrode formed on said collector layer; and
an emitter electrode formed on said emitter layer;
wherein an occupation ratio of said second base layer to said unit structure area is 0.4 or less.

2. The power transistor of claim 1, wherein said emitter layer is configured in a divided manner.

3. The power transistor of claim 1, wherein said power transistor is a current-driven type power transistor configured to apply a voltage between said base electrode and said emitter electrode.

4. The power transistor of claim 1, wherein said emitter layer has a dopant concentration higher than that of said first base layer.

5. The power transistor of claim 1, wherein said power transistor further comprises:
a high concentration layer of the second conductivity type formed, in the surface of said second base layer, adjacent to said emitter layer and having said base electrode formed thereon.

6. The power transistor of claim 1, wherein said power transistor further comprises:
a second conductivity type layer formed in the second surface of said first base layer, formed apart from said second base layer by a predetermined distance, and not including a first conductivity type layer therein; and
a second base electrode formed on said second conductivity type layer and electrically connected to said first base electrode.

7. The power transistor of claim 1, wherein said emitter electrode is configured to extend onto said first base layer with an insulating film therebetween, said insulating film being formed on said first base layer.

8. A power transistor comprising:
a base layer of a first conductivity type;
a collector layer of the first conductivity type formed in a first surface of said base layer of the first conductivity type;
a first base layer of a second conductivity type selectively formed in a second surface of said base layer of the first conductivity type;
a second base layer of the second conductivity type selectively formed in the second surface of said base layer of the first conductivity type, each of said first and second base layers corresponding to a unit structure area;
a first emitter layer of the first conductivity type formed in a surface of said first base layer;
a second emitter layer of the first conductivity type formed in a surface of said second base layer;
a first base electrode formed on the surface of said first base layer and adjacent to said first emitter layer;
a second base electrode formed on the surface of said second base layer and adjacent to said second emitter layer;
a collector electrode formed on said collector layer;
a first emitter electrode formed on said first emitter layer; and a second emitter electrode formed on said second emitter layer, wherein said first base layer of the second conductivity type and said second base layer of the second conductivity type are separated from each other by said base layer of the first conductivity type, wherein an occupation ratio of each of said first base layer and said second base layer to said unit structure area is 0.4 or less.

9. The power transistor of claim 8, wherein said power transistor is a current-driven power transistor configured to apply a voltage between said first base electrode and said first emitter electrode.

10. The power transistor of claim 8, wherein said power transistor further comprises:

a second conductivity type layer formed in the second surface of said base layer of the first conductivity type, formed between said first base layer of the second conductivity type and said second base layer of the second conductivity type, and not including a first conductivity type layer therein.

11. The power transistor of claim 8, wherein said power transistor further comprises:

a second conductivity type layer formed in the second surface of said base layer of the first conductivity type, formed between said first base layer of the second conductivity type and said second base layer of the second conductivity type, and not including a first conductivity type layer therein; and a third base electrode formed on said second conductivity type layer and electrically connected to said first and second base electrodes.

12. The power transistor of claim 8, wherein said first and second emitter electrodes are configured to extend onto said base layer of the first conductivity type with an insulating film therebetween, said insulating film being formed on said first base layer of the first conductivity type.

13. The power transistor of claim 1, wherein said power transistor further comprises:

a second conductivity type layer formed in the second surface of said first base layer, formed apart from said second base layer by a predetermined distance, and not including a first conductivity type layer therein.

14. The power transistor of claim 1, wherein each of said second base layers is separated from each other and has a rectangular shape on a plane perpendicular to a vertical section of the power transistor.

15. The power transistor of claim 1, wherein said emitter layer has a rectangular shape on a plane perpendicular to a vertical section of the power transistor.

16. The power transistor of claim 5, wherein said high concentration layer has a rectangular shape on a plane perpendicular to a vertical section of the power transistor.

17. The power transistor of claim 8, wherein said first emitter layer formed in the surface of said first base layer is configured in a divided manner, and said second emitter layer formed in the surface of said second base layer is configured in a divided manner.

18. The power transistor of claim 8, wherein said first base layer and said second base layer are separated from each other and have a rectangular shape on a plane perpendicular to a vertical section of the power transistor.

19. The power transistor of claim 8, wherein said first emitter layer and said second emitter layer have a rectangular shape on a plane perpendicular to a vertical section of the power transistor.

20. The power transistor of claim 8, further comprising:

a first high concentration layer of the second conductivity type formed in the surface of said first base layer and having said first base electrode formed thereon;

a second high concentration layer of the second conductivity type formed in the surface of said second base layer and layer having said second base electrode formed thereon, wherein said first and second high concentration layers have a rectangular shape on a plane perpendicular to a vertical section of the power transistor.

21. A power transistor comprising:

a first base layer of a first conductivity type;

a collector layer of the first conductivity type formed on a first surface of said first base layer;

a plurality of second base layers of a second conductivity type formed selectively in a second surface of said first base layer, each of the second base layers formed divided from each other and corresponding to a unit structure area;

an emitter layer of the first conductivity type formed in a surface of each of said second base layers;

a high concentration layer of the second conductivity type formed in the surface of each of said second base layers and adjacent to said emitter layer;

a first base electrode formed on said high concentration layer;

a collector electrode formed on said collector layer; and an emitter electrode formed on said emitter layer, wherein an occupation ratio of said emitter layer and said high concentration layer to said unit structure area is 0.1 or less.

22. The power transistor of claim 21, wherein said emitter layer is configured in a divided manner.

23. The power transistor of claim 21, wherein said power transistor further comprises:

a second conductivity type layer formed in the second surface of said first base layer, formed apart from said second base layer by a predetermined distance, and not including a first conductivity type layer therein; and a second base electrode formed on said second conductivity type layer and electrically connected to said first base electrode.

24. The power transistor of claim 21, wherein said power transistor further comprises:

a second conductivity type layer formed in the second surface of said first base layer, formed apart form said second base layer by a predetermined distance, and not including a first conductivity type layer therein.

25. The power transistor of claim 21, wherein said emitter electrode is configured to extend onto said first base layer with an insulating film therebetween, said insulating film formed on said first base layer.

26. The power transistor of claim 21, wherein each of said second base layers is separated from each other and has a rectangular shape on a plane perpendicular to a vertical section of the power transistor.

27. The power transistor of claim 21, wherein said emitter layer has a rectangular shape on a plane perpendicular to a vertical section of the power transistor.

28. The power transistor of claim 21, wherein said high concentration layer has a rectangular shape on a plane perpendicular to a vertical section of the power transistor.

29. A power transistor comprising:

a base layer of a first conductivity type;

a collector layer of the first conductivity type formed in a first surface of said base layer of the first conductivity type;

a first base of a second conductivity type selectively formed in a second surface of said base layer of the first conductivity type;

a second base layer of the second conductivity type selectively formed in the second surface of said base layer of the first conductivity type, each of said first and second base layers corresponding to a unit structure area;

a first emitter layer of the first conductivity type formed in a surface of said first base layer;

a second emitter layer of the first conductivity type formed in a surface of said second base layer;

a first high concentration layer of the second conductivity type formed in the surface of said first base layer and formed adjacent to said first emitter layer;

a second high concentration layer of the second conductivity type formed in the surface of said second base layer and formed adjacent to said first emitter layer;

a first base electrode formed on the surface of said first high concentration layer and formed adjacent to said first emitter layer;

a second base electrode formed on the surface of said second high concentration layer and formed adjacent to said second emitter layer;

a collector electrode formed on said collector layer of the first conductivity type;

a first emitter electrode formed on said first emitter layer of the first conductivity type; and a second emitter electrode formed on said second emitter layer of the first conductivity type;

wherein said first base layer of the second conductivity type and said second base layer of the second conductivity type are separated from each other by said base layer of the first conductivity type;

wherein an occupation ratio of said first emitter layer and said first high concentration layer to said unit structure area is 0.1 or less, and an occupation ratio of said second emitter layer and said second high concentration layer to said unit structure area is 0.1 or less.

30. The power transistor of claim 29, wherein said first emitter layer formed in the surface of said first base layer is configured in a divided manner, and said second emitter layer formed in the surface of said second base layer is configured in a divided manner.

31. The power transistor of claim 29, wherein said power transistor further comprises:

a second conductivity type layer formed in the second surface of said base layer of the first conductivity type, formed between said first base layer and said second base layer, and not including a first conductivity type layer therein.

32. The power transistor of claim 29, wherein said power transistor further comprises:

a second conductivity type layer formed in the second surface of said base layer of the first conductivity type, formed between said first base layer and said second base layer, and not including a first conductivity type layer therein; and a third base electrode formed on said second conductivity type layer and electrically connected to said first and second base electrodes.

33. The power transistor of claim 29, wherein said first and second emitter electrodes are configured to extend onto said base layer of the first conductivity type with an insulating film therebetween, said insulating film being formed on said first base layer of the first conductivity type.

34. The power transistor of claim 29, wherein said first base layer and said second base layer are separated each other and have a rectangular shape on a plane perpendicular to a vertical section of the power transistor.

35. The power transistor of claim 29, wherein said first emitter layer and said second emitter layer have a rectangular shape on a plane perpendicular to a vertical section of the power transistor.

36. The power transistor of claim 29, wherein said first and second high concentration layers have a rectangular shape on a plane perpendicular to a vertical section of the power transistor.

* * * * *